(12) United States Patent
Oh

(10) Patent No.: US 7,976,642 B2
(45) Date of Patent: Jul. 12, 2011

(54) BOX CLEANER FOR CLEANING WAFER SHIPPING BOX

(75) Inventor: Se-Youl Oh, Gumi-si (KR)

(73) Assignee: Siltron, Inc., Gumi (KR)

( * ) Notice: Subject to any disclaimer, the term of this patent is extended or adjusted under 35 U.S.C. 154(b) by 290 days.

(21) Appl. No.: 12/236,984

(22) Filed: Sep. 24, 2008

(65) Prior Publication Data

US 2009/0084416 A1 Apr. 2, 2009

(30) Foreign Application Priority Data

Sep. 28, 2007 (KR) .......................... 10-2007-0097817

(51) Int. Cl.
*B08B 3/04* (2006.01)
(52) U.S. Cl. ..................... 134/166 R; 134/171; 134/186
(58) Field of Classification Search .............. 134/166 R, 134/171, 186
See application file for complete search history.

(56) References Cited

U.S. PATENT DOCUMENTS

| 4,437,479 | A | * | 3/1984 | Bardina et al. ................... 134/68 |
| 4,573,505 | A | * | 3/1986 | Lee et al. ........................ 141/92 |
| 4,941,489 | A | * | 7/1990 | Kamimura et al. .......... 134/95.3 |
| 5,301,700 | A | * | 4/1994 | Kamikawa et al. ............. 134/76 |
| 5,331,987 | A | | 7/1994 | Hayashi et al. |
| 5,363,867 | A | * | 11/1994 | Kawano et al. .............. 134/95.2 |
| 5,698,038 | A | | 12/1997 | Guldi et al. |
| 5,715,851 | A | * | 2/1998 | Jung et al. ..................... 134/155 |
| 5,738,128 | A | * | 4/1998 | Thompson et al. .......... 134/95.2 |
| 5,793,833 | A | * | 8/1998 | Imai ................................ 377/10 |
| 2001/0020480 | A1 | * | 9/2001 | Yoshikawa et al. .......... 134/22.1 |
| 2002/0130106 | A1 | | 9/2002 | Mertens et al. |
| 2003/0188770 | A1 | | 10/2003 | Doi |
| 2004/0079393 | A1 | | 4/2004 | Breese et al. |
| 2005/0039779 | A1 | | 2/2005 | Ohtsuka |
| 2006/0281326 | A1 | * | 12/2006 | Ose et al. ....................... 438/745 |
| 2007/0125404 | A1 | * | 6/2007 | Davis et al. ..................... 134/33 |

FOREIGN PATENT DOCUMENTS

| DE | 26 43 379 | * | 3/1978 |
| DE | 100 63 425 | * | 7/2002 |
| EP | 1066 887 | | 1/2001 |
| GB | 2 107 685 | * | 5/1983 |
| JP | 61-194727 | * | 8/1986 |
| JP | 62190729 | * | 8/1987 |
| JP | 64-012534 | * | 1/1989 |
| JP | 09-260324 | * | 10/1997 |

(Continued)

OTHER PUBLICATIONS

WIPO WO 2004/093147 Oct. 2004.*

*Primary Examiner* — Frankie L Stinson
(74) *Attorney, Agent, or Firm* — Greer, Burns & Crain, Ltd.

(57) ABSTRACT

The present invention relates to a box cleaner including an ultrasonic cleaning bath having a receiving space to be filled with DIW and an ultrasonic wave generator arranged at a bottom thereof; a tray for loading a wafer shipping box thereon; a lift for providing a driving force to put the tray into the ultrasonic cleaning bath and take the tray out of the ultrasonic cleaning bath; and a drying system for drying the cleaned shipping box, wherein a gas sprayer is installed in the ultrasonic cleaning bath for spraying gas into the cleaned shipping box to push the DIW out of the shipping box, thereby draining the DIW.

6 Claims, 5 Drawing Sheets

FOREIGN PATENT DOCUMENTS

| | | | |
|---|---|---|---|
| JP | 09-276747 | * | 10/1997 |
| JP | 11-316084 | | 11/1999 |
| JP | 200-164553 | * | 6/2000 |
| KR | 10-2005-58852 | | 6/2005 |
| WO | WO 00/69575 | | 11/2000 |
| WO | WO 01/08820 | | 2/2001 |

* cited by examiner

BOX CLEANER FOR CLEANING WAFER SHIPPING BOX

TECHNICAL FIELD

The present invention relates to a box cleaner, and in particular, to a box cleaner configured to reduce load occurring when lifting up a tray after cleaning of a wafer shipping box, and to prevent contamination that may occur during drying of the wafer shipping box.

BACKGROUND

Silicon wafers are cleaned and inspected, and then they are contained in a shipping box and shipped. The shipping box is a container formed by molding a resin, and used after passing though a box cleaning process to prevent contamination that may occur during packaging and transportation.

A box cleaner is used to clean and dry the shipping box in the box cleaning process, and typically includes a tray, a loader, an unloader, a cleaning bath, an ultrasonic wave generator, a rinsing unit, and a drying system. The tray is a jig used to individually clean components of the shipping box. The loader loads the components of the shipping box onto the tray. The unloader unloads the components of the shipping box after the components of the shipping box are cleaned. The cleaning bath contains a deionized water (DIW) that the components of the shipping box loaded on the tray are dipped and cleaned. The ultrasonic wave generator generates ultrasonic waves at the bottom of the cleaning bath to remove micro-particles. The rinsing unit sprays DIW with high pressure to remove impurities and micro-particles remaining after irradiation of ultrasonic waves. The drying system dries out moisture remaining after a rinsing process using clean dry air (CDA) of high temperature or vacuum.

A conventional box cleaner was configured such that the components of the shipping box are loaded onto the tray and dipped in the cleaning bath with the bottom of the shipping box facing the surface of DIW, that is, with an opening of the shipping box facing downward, for example upside down, to improve a cleaning performance. The box cleaner of this structure has a weakness: when lifting up the tray after cleaning of the components of the shipping box, a large quantity of DIW in the shipping box is lifted up with the tray by surface tension, but not drained. As a result, an excessive load occurs to a lift shaft, and durability of an equipment is reduced.

And, the conventional box cleaner uses a scanning method in a drying process of the shipping box using CDA such that the tray is moved horizontally while a CDA nozzle spraying CDA is fixed. The scanning method is not suitable for a shipping box for wafers of complicated structure having 12 inches or more in diameter. And, an excessive friction occurs to an O-ring of a roller for transferring the tray by weight of the tray, resulting in powder generation. As a result, the shipping box may be contaminated after cleaning of the shipping box.

Meanwhile, after the shipping box is cleaned and dried using the conventional box cleaner, the shipping box should be separated from the tray and pass through a natural drying process in a clean room. Accordingly, the shipping box may be contaminated during the handling process and the natural drying process.

SUMMARY

Therefore, the present invention is designed to solve the above-mentioned problems of the prior arts, and therefore it is an object of the present invention to provide a box cleaner configured to drain DIW in a shipping box when lifting up the shipping box from a cleaning bath after cleaning of the shipping box.

It is another object of the present invention to provide a box cleaner configured to dry the shipping box in such a state that a tray loading the shipping box is fixed.

It is yet another object of the present invention to provide a box cleaner including a substitute for a conventional natural drying system using a clean room to prevent contamination that may occur during a natural drying process.

To achieve the above-mentioned objects, the present invention provides a box cleaner that when lifting up a tray after cleaning of a wafer shipping box, sprays a high purity gas free of impurities into the shipping box to drain DIW.

A box cleaner according to the present invention includes an ultrasonic cleaning bath having a receiving space to be filled with DIW and an ultrasonic wave generator arranged at a bottom thereof; a tray for loading a wafer shipping box thereon; a lift for providing a driving force to put the tray into the ultrasonic cleaning bath and take the tray out of the ultrasonic cleaning bath; and a drying system for drying the cleaned shipping box, wherein a gas sprayer is installed in the ultrasonic cleaning bath for spraying gas into the cleaned shipping box to push the DIW out of the shipping box, thereby draining the DIW.

Preferably, the gas sprayer is arranged at a bottom of the tray along a lengthwise direction of the tray, and is formed of a bubble pipe having a plurality of through-holes in a body thereof.

Preferably, the gas sprayed into the shipping box by the gas sprayer is a nitrogen gas ($N_2$).

The clean box includes a moving plate having a CDA (Clean Dry Air) nozzle attached thereto for spraying CDA into the shipping box loaded on the tray; and a driving tool for horizontally moving the moving plate to enable the CDA nozzle to make scanning.

Preferably, a flexible tube is connected to the CDA nozzle for CDA supply.

The clean box may further include a CAH (Clean Air Hood) filtering system for removing lightweight moisture and air born particles generated after drying of the shipping box. And, the clean box may further include a constant temperature constant humidity chamber for improving a drying efficiency of the CAH filtering system.

According to another aspect of the present invention, an ultrasonic cleaning system of a box cleaner includes an ultrasonic cleaning bath having a receiving space to be filled with DIW and an ultrasonic wave generator arranged at a bottom thereof; a tray for loading a wafer shipping box thereon; and a lift for providing a driving force to put the tray into the ultrasonic cleaning bath and take the tray out of the ultrasonic cleaning bath, wherein a gas sprayer is installed at a side of the ultrasonic cleaning bath for spraying gas into the cleaned shipping box to push the DIW out of the shipping box, thereby draining the DIW.

According to yet another aspect of the present invention, a drying system of a box cleaner for drying a cleaned wafer shipping box, includes a CDA nozzle for spraying CDA into the shipping box loaded on a tray; and a driving tool for providing a driving force to the CDA nozzle in such a state that the tray is fixed, to horizontally move the CDA nozzle, thereby making a CDA scanning.

DETAILED DESCRIPTION

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. In the case that the following description shows a layer exists on another layer, this may be interpreted that the layer may exist directly on another layer or a third layer may be interposed therebetween.

Figure 1:
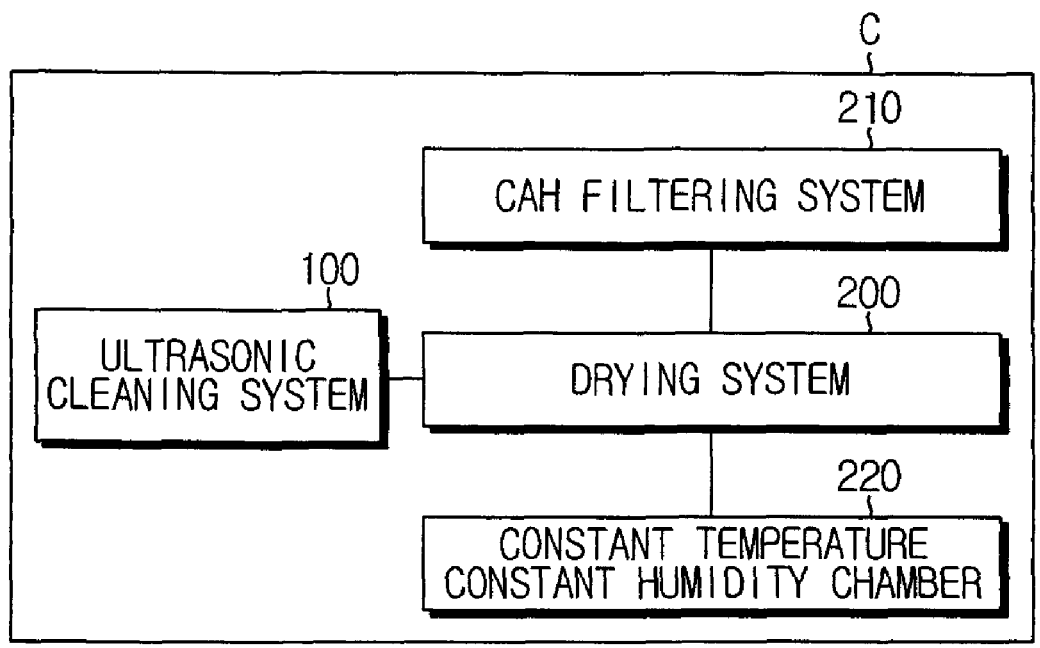
FIG. 1 is a system configuration diagram illustrating a box cleaner according to a preferred embodiment of the present invention.

As shown in FIG. 1, a box cleaner (C) according to a preferred embodiment of the present invention includes an ultrasonic cleaning system 100 and a drying system 200. The ultrasonic cleaning system 100 clean a shipping box 10 by dipping the shipping box 10 in deionized water (DIW) in the box cleaner (C) and irradiating ultrasonic waves. The drying system 200 dries moisture remaining on the shipping box 10 after cleaning of the shipping box 10.

Figure 2:
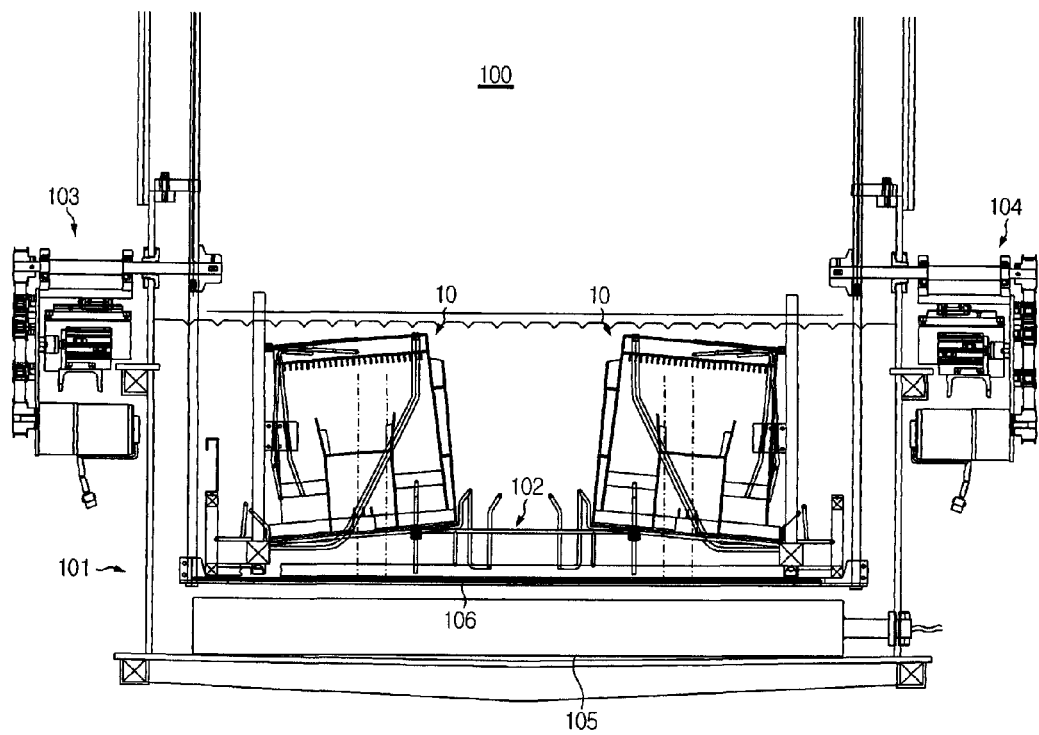
FIG. 2 is a side view illustrating a configuration of an ultrasonic cleaning system of the box cleaner according to a preferred embodiment of the present invention.

FIG. 2 is a side view illustrating a configuration of the ultrasonic cleaning system 100 of the box cleaner (C) according to a preferred embodiment of the present invention.

Referring to FIG. 2, the box cleaner (C) according to a preferred embodiment of the present invention includes an ultrasonic cleaning bath 101, a tray 102, lifts 103 and 104 and a gas sprayer 106. The ultrasonic cleaning bath 101 has a receiving space to be filled with DIW. The tray 102 is a jig used to load components (hereinafter commonly referred to as 'a shipping box 10') of a wafer shipping box therein. The lifts 103 and 104 provide a driving force to put the tray 102 into and take the tray 102 out of the ultrasonic cleaning bath 101. The gas sprayer 106 sprays a high purity gas into the shipping box 10.

The receiving space of the ultrasonic cleaning bath 101 is filled with DIW, so that the shipping box 10 loaded on the tray 102 is dipped in the DIW and cleaned by the DIW. An ultrasonic wave generator 105 is installed on the bottom of the ultrasonic cleaning bath 101, and irradiates the dipped shipping box 10 with ultrasonic waves of, for example about 40 kHz to remove micro-particles.

The lifts 103 and 104 each includes a power converting tool having a gear assembly, a roller or a pulley to lift up and down the tray 102, and a driving motor connected to the power converting tool. The lifts 103 and 104 put the tray 102 having the shipping box 101 into the ultrasonic cleaning bath 101 or take the tray 102 out of the ultrasonic cleaning bath 101 after cleaning of the shipping box 10. Here, the detailed configuration of the power converting tool and the driving motor of the lifts 103 and 104 and connection relation therebetween are the same as those of a conventional box cleaner, and its detailed description is omitted.

Figure 3:
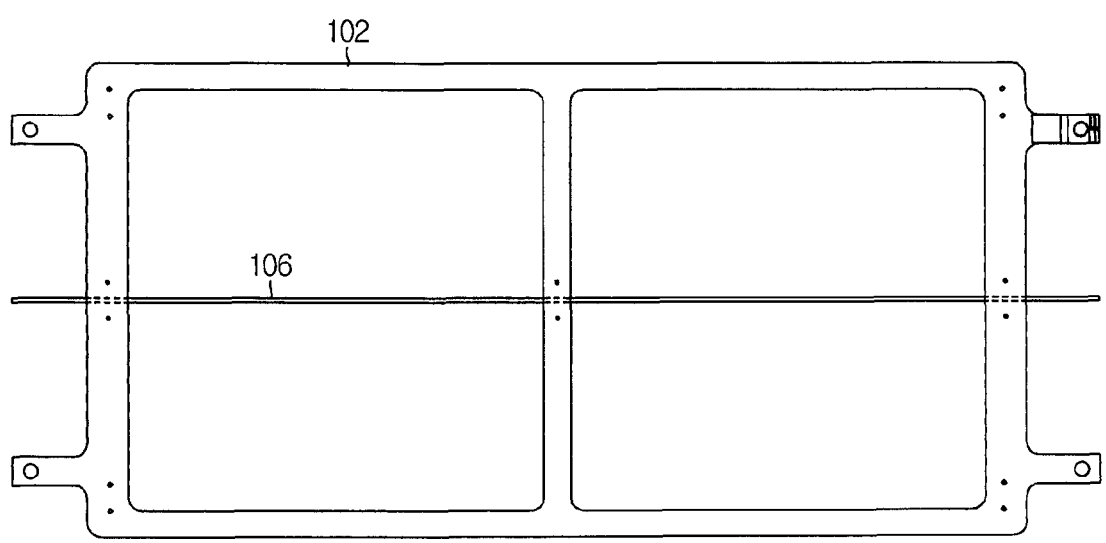
FIG. 3 is a plan view illustrating an arrangement structure of a gas sprayer of FIG. 2.

After cleaning of the shipping box 10 is completed, the gas sprayer 106 sprays a high purity gas, for example, a nitrogen gas (N2) into the shipping box 10 to drain the DIW in the shipping box 10. Preferably, the gas sprayer 106 is formed of a bubble pipe having a plurality of through-holes arranged in a lengthwise direction thereof, however the present invention is not limited in this regard, and sprayers of various shapes having a spray nozzle may be used. In FIG. 3, for effective gas spray, the gas sprayer 106 of a bubble pipe structure is configured to extend on a lower portion of a base of the tray 102 along a lengthwise direction of the tray 102.

Preferably, the box cleaner (C) further includes a rinsing unit (not shown) for spraying DIW with high pressure to remove impurities and micro-particles remaining after irradiation of ultrasonic waves.

Figure 4:
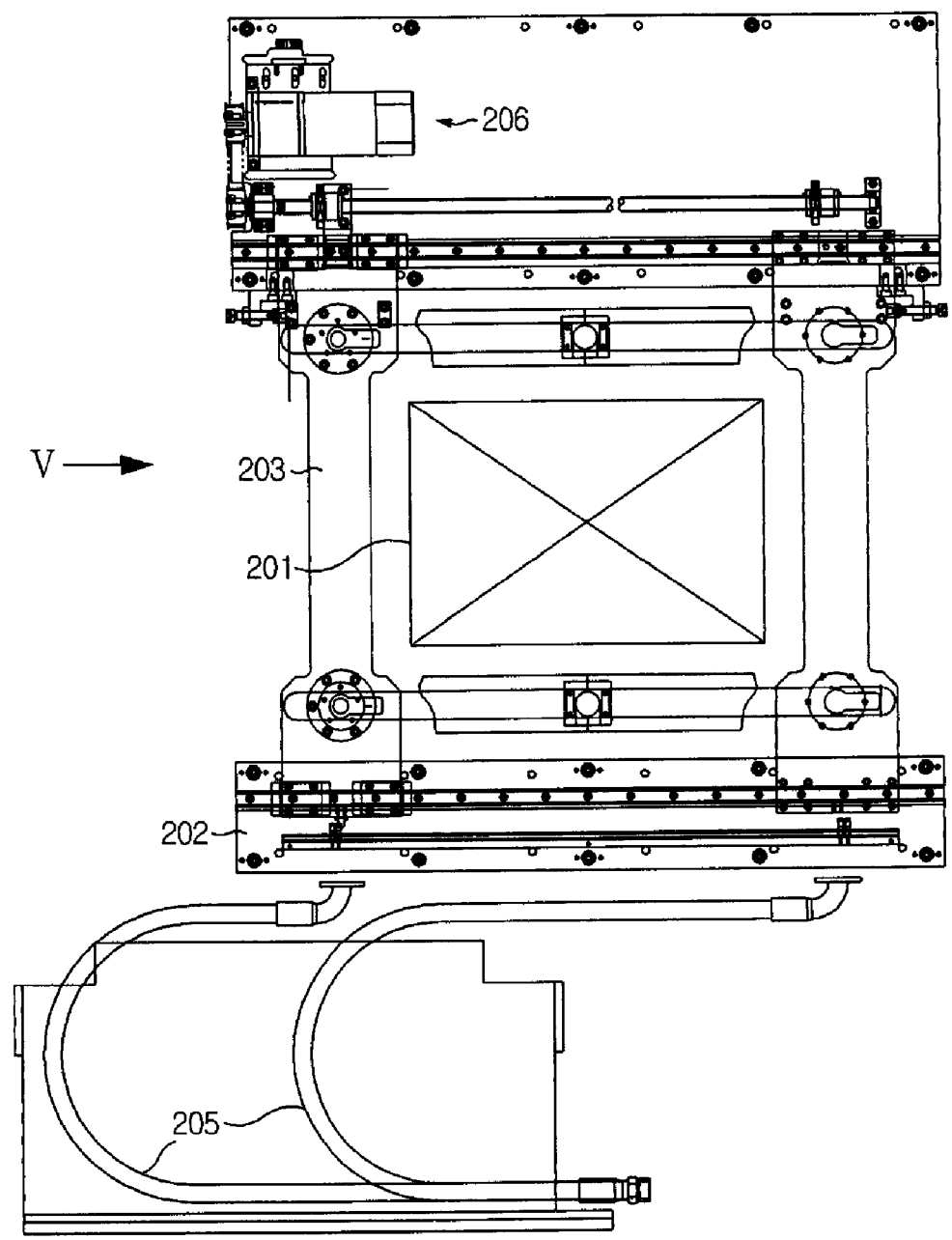
FIG. 4 is a front view illustrating a configuration of a drying system of the box cleaner according to a preferred embodiment of the present invention.

FIG. 4 illustrates a configuration of the drying system 200 of the box cleaner (C) according to a preferred embodiment of the present invention.

Figure 5:
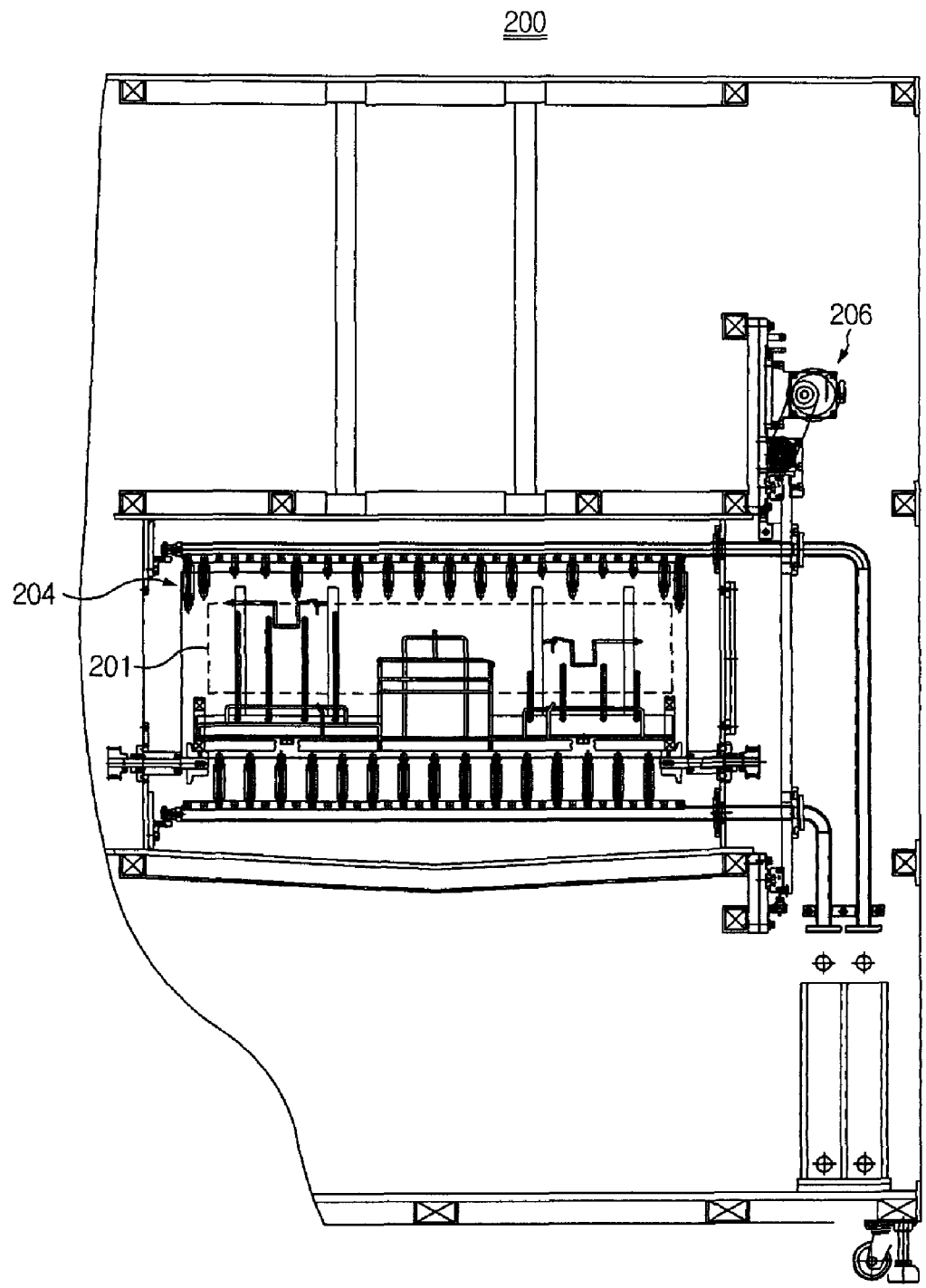
FIG. 5 is a side view taken in the direction of V of FIG. 4.

The drying system 200 of the box cleaner (C) dries moisture remaining on the shipping box 10 cleaned by the ultrasonic cleaning system 100. For this purpose, the drying system 200 of the box cleaner (C) includes a shipping box loader 201 for loading the cleaned shipping box 10, a moving plate 203 having a CDA nozzle (204 of FIG. 5) attached thereto for spraying CDA into the shipping box 10, and a driving tool 206 for moving horizontally the CDA nozzle 204 with a regular speed to perform CDA scanning on the shipping box 10.

The shipping box loader 201 loads the shipping box 10 on the tray (102 of FIG. 3) in a fixed state.

The moving plate 203 is placed on a pair of base plates 202 and coupled to the base plates 202 by a predetermined bearing, and is installed movably horizontally relative to the shipping box loader 201.

The driving tool 206 provides a driving force to the moving plate 203 to enable the CDA nozzle 204 to scan the shipping box loader 201. For this purpose, the driving tool 206 includes a power converting means having a well-known gear assembly, roller or pulley to move horizontally the moving plate 203, and a driving motor connected to the power converting means.

The drying system 200 of the box cleaner (C) moves the CDA nozzle 204 while fixing the tray 102 to perform CDA scanning on the shipping box 10. Preferably an air supply tube is connected to the CDA nozzle 204 for CDA supply, and a flexible tube having excellent durability at high temperature and free flexibility is used as the air supply tube.

The box cleaner (C) includes a CAH (Clean Air Hood) filtering system 210 installed therein to remove air born particles generated in a drying process. The CAH filtering system 210 removes lightweight moisture remaining after a drying process using CDA, and cools the shipping box 10 and the tray 102. Here, a structure of the CAH filtering system 210 is well known, and its detailed description is omitted.

And, the box cleaner (C) further includes a typical constant temperature constant humidity chamber 220 installed therein. The constant temperature constant humidity chamber 220 provides advantages of effectively drying the shipping box 10 of a complicated mold and reducing the time spent in aging the shipping box 10.

The box cleaner (C) of the above-mentioned configuration according to a preferred embodiment of the present invention sequentially performs cleaning, drying and cooling processes in a continuous method while transferring the shipping box 10 loaded on the tray 102.

For this purpose, the ultrasonic cleaning system 100 of the box cleaner (C) cleans, using ultrasonic waves, the shipping box 10 dipped in DIW such that the shipping box 10 is put on a basket with the bottom of the shipping box 10 facing the surface of DIW. After cleaning of the shipping box 10, a nitrogen gas (N₂) is sprayed into the shipping box 10 using the gas sprayer 106 of a bubble pipe structure. A cradle is lifted up to take the shipping box 10 loaded on the tray 102 out of the ultrasonic cleaning bath 101. And, DIW in the shipping box 10 is pushed out by the nitrogen gas (N₂) filled in the shipping box 10, so that the DIW is drained.

The cleaned shipping box 10 is provided to the drying system 200 of the box cleaner (C), fixed to the tray 102 and dried by scanning of the CDA nozzle 204 moving horizontally.

Moisture or particles remaining on the shipping box 10 and the tray 102 is removed by the CAH filtering system 210 and the constant temperature constant humidity chamber 220 of the box cleaner (C). A drying process of the shipping box 10 is completed in this way.

According to the present invention, when lifting up the shipping box after cleaning of the shipping box, DIW in the shipping box is drained to reduce load applied on a lift shaft, thereby improving durability of an equipment.

And, in a drying process, the present invention performs a dry scanning by moving the CDA nozzle, on which load is applied relatively low, while fixing the tray loading the shipping box, and thus can prevent generation of powder due to friction. The present invention can perform a natural drying process of the shipping box in a continuous method while staying the shipping box in the box cleaner, but not taking the shipping box out of the box cleaner, thereby preventing contamination of the shipping box.

It should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. A box cleaner, comprising:
an ultrasonic cleaning bath having a receiving space to be filled with DIW (Deionized Water) and an ultrasonic wave generator arranged at a bottom thereof;
a tray for loading a wafer shipping box thereon;
a lift for providing a driving force to put the tray into the ultrasonic cleaning bath and take the tray out of the ultrasonic cleaning bath; and
a drying system for drying the cleaned shipping box,
wherein a gas sprayer is installed in the ultrasonic cleaning bath for spraying gas into the cleaned shipping box to push the DIW out of the shipping box, thereby draining the DIW, and
wherein the drying system includes:
a moving plate having a CDA (Clean Dry Air) nozzle attached thereto for spraying CDA into the shipping box loaded on the tray; and
a driving tool for horizontally moving the moving plate to enable the CDA nozzle to make scanning.

2. The box cleaner according to claim 1,
wherein the gas sprayer is arranged at a bottom of the tray along a lengthwise direction of the tray, and is formed of a bubble pipe having a plurality of through-holes in a body thereof.

3. The box cleaner according to claim 1,
wherein the gas is a nitrogen gas (N₂).

4. The box cleaner according to claim 1, further comprising:
a flexible tube connected to the CDA nozzle for CDA supply.

5. The box cleaner according to claim 1, further comprising:
a CAH (Clean Air Hood) filtering system for removing lightweight moisture and airborne particles generated after drying of the shipping box.

6. The box cleaner according to claim 5, further comprising:
a constant temperature constant humidity chamber for improving a drying efficiency of the CAH filtering system.

* * * * *